(12) United States Patent
Luo

(10) Patent No.: US 11,862,723 B2
(45) Date of Patent: Jan. 2, 2024

(54) INTEGRATED CIRCUIT MEMORY AND MANUFACTURING METHOD THEREOF, AND SEMICONDUCTOR INTEGRATED CIRCUIT DEVICE

(71) Applicant: CHANGXIN MEMORY TECHNOLOGIES, INC., Hefei (CN)

(72) Inventor: Qu Luo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 220 days.

(21) Appl. No.: 17/389,898

(22) Filed: Jul. 30, 2021

(65) Prior Publication Data

US 2022/0059694 A1    Feb. 24, 2022

Related U.S. Application Data

(63) Continuation of application No. PCT/CN2021/071629, filed on Jan. 14, 2021.

(30) Foreign Application Priority Data

Aug. 20, 2020  (CN) .......................... 202010842887.4

(51) Int. Cl.
*H01L 29/78* (2006.01)
*H01L 29/66* (2006.01)
*H10B 12/00* (2023.01)

(52) U.S. Cl.
CPC .... *H01L 29/7827* (2013.01); *H01L 29/66666* (2013.01); *H10B 12/05* (2023.02); *H10B 12/315* (2023.02)

(58) Field of Classification Search
CPC .......... H01L 29/7827; H01L 29/66666; H01L 29/78642; H10B 12/05; H10B 12/315; H10B 12/488; H10B 12/30; H10B 12/482
USPC ........................................................ 257/296
See application file for complete search history.

(56) References Cited

U.S. PATENT DOCUMENTS

| 7,646,041 | B2 | 1/2010 | Chae |
| 7,713,823 | B2 | 5/2010 | Sung |
| 8,036,043 | B2 | 10/2011 | Oh |
| 8,237,220 | B2 | 8/2012 | Sung |
| 2006/0097304 | A1 | 5/2006 | Yoon |
| 2008/0128757 | A1 | 6/2008 | Chae |
| 2009/0114981 | A1 | 5/2009 | Sung |

(Continued)

FOREIGN PATENT DOCUMENTS

| CN | 101425515 A | 5/2009 |
| CN | 101635171 A | 1/2010 |

(Continued)

OTHER PUBLICATIONS

Supplementary European Search Report in the European application No. 21857110.7, dated Jul. 4, 2023. 8 pages.

*Primary Examiner* — Mohammad M Hoque
(74) *Attorney, Agent, or Firm* — Syncoda LLC; Feng Ma

(57) ABSTRACT

A manufacturing method of an integrated circuit memory includes: a substrate is provided; a bit line extending along a first direction is formed on the substrate; a word line extending along a second direction is formed on the bit line; and a vertical storage transistor is formed in an overlapping region where the word line and the bit line are spatially intersected, the vertical storage transistor being located on the bit line, and connected to the bit line.

20 Claims, 20 Drawing Sheets

(56) References Cited

U.S. PATENT DOCUMENTS

| | | |
|---|---|---|
| 2009/0189217 A1 | 7/2009 | Yoon |
| 2010/0020617 A1 | 1/2010 | Oh |
| 2010/0219466 A1 | 9/2010 | Sung |
| 2019/0296155 A1 | 9/2019 | Sawabe |

FOREIGN PATENT DOCUMENTS

| | | | |
|---|---|---|---|
| CN | 208127209 U | * | 11/2018 |
| CN | 208127209 U | | 11/2018 |
| CN | 109390400 A | | 2/2019 |
| CN | 109979939 A | | 7/2019 |

* cited by examiner

INTEGRATED CIRCUIT MEMORY AND MANUFACTURING METHOD THEREOF, AND SEMICONDUCTOR INTEGRATED CIRCUIT DEVICE

CROSS-REFERENCE TO RELATED APPLICATIONS

This application is a continuation of International Application No. PCT/CN2021/071629 filed on Jan. 14, 2021, which claims priority to Chinese Patent Application No. 202010842887.4 filed on Aug. 20, 2020. The disclosures of these applications are hereby incorporated by reference in their entirety.

BACKGROUND

While the level of integration of semiconductor manufacturing processes is constantly increased, it has been a trend to improve an integration density of memories. However, the development of existing technologies is always limited by resolutions of lithography devices attainable at that time. Specifically, sizes of semiconductor integrated circuit devices, such as minimum sizes of Critical Dimensions (CDs) and spaces (S), rely upon the resolution capability of the lithography device. Hence, under the limitation of the attainable minimum feature size of the lithography device, patterns less than the minimum feature size cannot be acquired stably. This will limit the further reduction of the size of the semiconductor device, and fail to further improve the density of arrangement of unit elements in the semiconductor devices.

SUMMARY

The disclosure relates to the technical field of semiconductors, and more particularly, to an integrated circuit memory and a manufacturing method thereof, and a semiconductor integrated circuit device.

According to various examples of the disclosure, an integrated circuit memory and a manufacturing method thereof, and a semiconductor integrated circuit device are provided.

A manufacturing method of an integrated circuit memory may include the following operations.

A substrate is provided.

A bit line is formed on the substrate, in which the bit line extends along a first direction;

A word line is formed on the bit line, in which the word line extends along a second direction;

A vertical storage transistor is formed in an overlapping region where the word line and the bit line are spatially intersected, and the vertical storage transistor is located on the word line and connected to the bit line.

An integrated circuit memory may include: a substrate, a bit line, a word line and a vertical storage transistor.

The bit line is formed on the substrate and extends along a first direction.

The word line is formed on the bit line and extends along a second direction.

The vertical storage transistor is formed in an overlapping region where the word line and the bit line are spatially intersected, located on the word line, and connected to the bit line.

A semiconductor integrated circuit device may include: a substrate, a first conducting line, a second conducting line and a vertical storage transistor.

The first conducting line is formed on the substrate and extends along a first direction.

The second conducting line is formed on the first conducting line and extends along a second direction.

The vertical storage transistor is formed in an overlapping region where the second conducting line and the first conducting line are spatially intersected, located in the second conducting line, and connected to the first conducting line.

Details of one or more examples of the disclosure are proposed in the following accompanying drawings and descriptions. Other features, objectives and advantages of the disclosure will be apparent in the descriptions, accompanying drawings and claims.

BRIEF DESCRIPTION OF THE DRAWINGS

In order to describe the technical solutions in the examples or conventional art of the disclosure more clearly, a simple introduction on the accompanying drawings which are needed in the description of the examples or conventional art is given below. Apparently, the accompanying drawings in the description below are merely some of the examples of the disclosure, based on which other drawings may be obtained by those of ordinary skill in the art without any creative effort.

DETAILED DESCRIPTION

Figure 1:
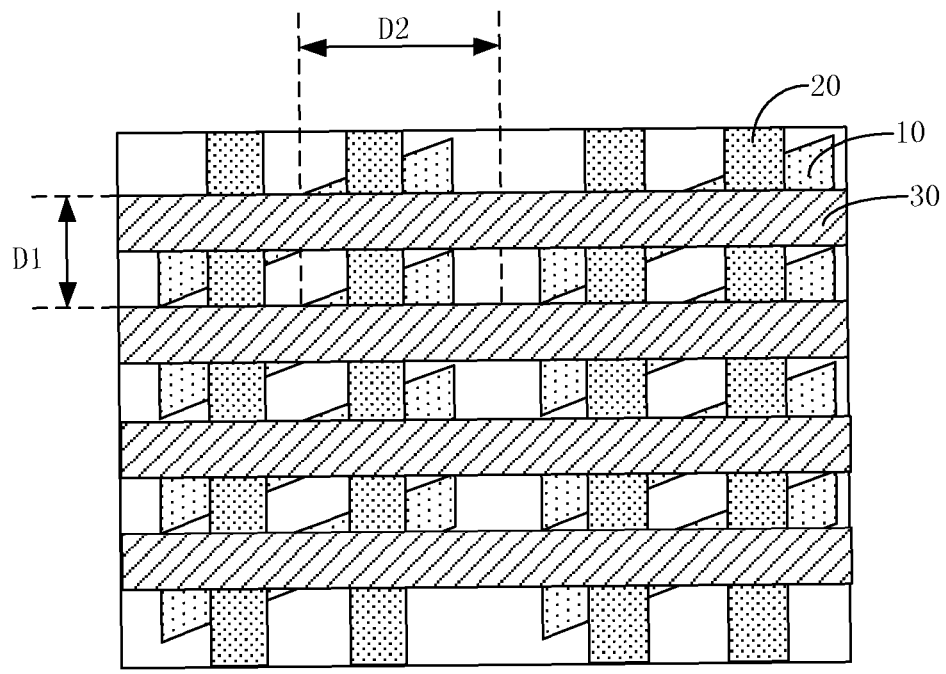
FIG. 1 illustrates a structural schematic diagram of a typical integrated circuit memory.

For the ease of understanding the disclosure, the disclosure is described more completely with reference to related accompanying drawings. The examples of the disclosure are given in the accompanying drawings. However, the disclosure may be implemented in many different forms and is not limited to the examples described herein. Conversely, these examples are provided to make the disclosures of the disclosure more thorough and complete.

Unless otherwise defined, all technical and scientific terms used herein have a same meaning generally understood by those skilled in the art of the disclosure. The terms used in the specification of the disclosure are merely to describe the specific examples, rather than to limit the disclosure.

It will be understood that in a case that an element or layer is referred to as being "on", "adjacent to" and "connected to" other element or layer, it can be directly on the other element or layer, or intervening elements or layers may be present. In contrast, when an element is referred to as being "directly on", "directly adjacent to", "directly connected to" or "directly coupled to" other element or layer, there are no intervening elements or layers present. It will be understood that, although the terms first, second, third, and the like may be used herein to describe various elements, components, regions, layers, doping types and/or sections, these elements, components, regions, layers, doping types and/or sections should not be limited by these terms. These terms are only used to distinguish one element, component, region, layer, doping type or section from another element, component, region, layer, doping type or section. Thus, a first element, component, region, layer, doping type or section discussed below could be termed a second element, component, region, layer or section without departing from the teachings of the disclosure. For example, the first doping type may be termed the second doping type, and similarly, the second doping type may be termed the first doping type. The first doping type and the second doping type are different doping types, for example, the first doping type may be a P type and the second doping type may be an N type, or the first doping type may be the N type and the second doping type may be the P type.

Spatially relative terms, such as "beneath", "below", "lower", "above", "on", "upper" and the like, may be used herein for ease of description to describe one element or feature's relationship with another element or feature as illustrated in the figures. It will be understood that the spatially relative terms are intended to encompass different orientations of the device in use or operation in addition to the orientation depicted in the figures. For example, if the device in the figures is turned over, elements or features described as "below other element" or "beneath" or "under" would then be oriented "above" the other element or feature. Thus, the exemplary terms "beneath" and "below" can encompass both an orientation of above and below. In addition, the device may also include other orientation (such as 90° of rotation or other orientation), and the spatial description term used herein is correspondingly explained.

As used herein, the singular forms "a", "an" and "said/the" are intended to include the plural forms as well, unless the context clearly indicates otherwise. It will be further understood that the terms "comprise/comprising" or "having" specify the presence of stated features, integers, steps, operations, components, portions or combinations thereof, but do not preclude the presence or addition of one or more other features, integers, steps, operations, components, portions or combinations thereof. Meanwhile, in the specification, the term "and/or" includes any and all combinations of the associated listed items.

For the memories (for example, the Dynamic Random-Access Memory (DRAM)), a storage unit includes a storage transistor and a storage capacitor connected thereto, and the storage capacitor is configured to store charges that represent storage information. An active region, a drain region and a gate are formed in the storage transistor, the gate is configured to control current flowing between the source region and the drain region and connected to a word line, the drain region is configured to form a bit line contact region to connect to a bit line, and the source region is configured to form a storage node contact region to connect to the storage capacitor. The source region, channel region and drain region of the storage transistor are horizontally distributed along a direction parallel to a surface of the substrate; and in a case where the storage transistor of the storage unit is conducted normally, a channel current flows along a horizontal direction between the source region and the drain region overall. Hence, when the storage transistor is reduced to a predetermined size, a short-channel effect of the storage transistor tends to occur.

The examples of the disclosure are described herein with reference to sectional views that are used as schematic diagrams of ideal examples (intermediate structures) of the disclosure, such that changes in shape may be anticipated due to for example the manufacturing techniques and/or tolerances. Hence, the examples of the disclosure should not be limited to special shapes of the regions shown herein but include shape deviations caused by the manufacturing techniques. For example, the injection region displayed as a rectangle is typically provided with a circular or curved feature at the edge and/or an injection concentration gradient, rather than a binary change from the injection region to the non-injection region. Likewise, the buried region formed by injection may lead to some injection in the buried region and a region between surfaces passed when the injection is performed. Therefore, the regions shown in the figures are substantially schematic, and the shapes thereof neither represent the actual shape of the regions of the device nor limit the scope of the disclosure.

FIG. 1 illustrates a structural schematic diagram of a typical memory. As shown in FIG. 1, the memory includes: a substrate, a word line 20 and a bit line 30. Multiple active regions 10 are defined in the substrate. The active region 10 is provided with a first doped region and two second doped regions located on two sides of the first doped region.

The word line 20 is formed on the substrate and intersected with the corresponding active region 10. The position where the word line 20 is intersected with the active region 10 is configured to form a gate of a storage transistor.

The bit line 30 is formed on the substrate and electrically connected to the first doped region of the corresponding active region 10, so as to lead out the first doped region.

The active region 10 of the storage transistor is formed by horizontal diffusion, i.e., the first doped region and the second doped region are horizontally distributed in a direction parallel to a surface of the substrate, thereby forming a storage transistor with a horizontal structure. When the size of the storage transistor is reduced, i.e., the size of the corresponding active region 10 is reduced, the risk of the short-channel effect increases easily. In addition, even though the short-channel effect of the transistor is not taken into account, the size of the storage transistor still cannot be further reduced under the limitation of the resolution of the lithography device. The storage transistor has a width D2 of 3F in a direction perpendicular to the word line 20, and a width D1 of 2F in a direction perpendicular to the bit line 30. The area configured for the storage transistor on the substrate is $6F^2$ (3F*2F, i.e., 3*2 buried type word line structure), where, F is the minimum feature size, i.e., the minimum critical dimension size and the minimum critical space size that can be obtained based on the resolution of the lithography device at present. The minimum critical dimension size and the minimum critical space size are equal, i.e., based on the resolution of the existing lithography device, the unit size of the manufactured storage transistor can only reach $6F^2$, and cannot be reduced any more.

In addition, in the memory shown in FIG. 1, a bit line contact hole is further additionally manufactured above the second doped region of the active region so as to connect the second doped region and the bit line, and the manufacturing process is relatively complex.

Figure 2:
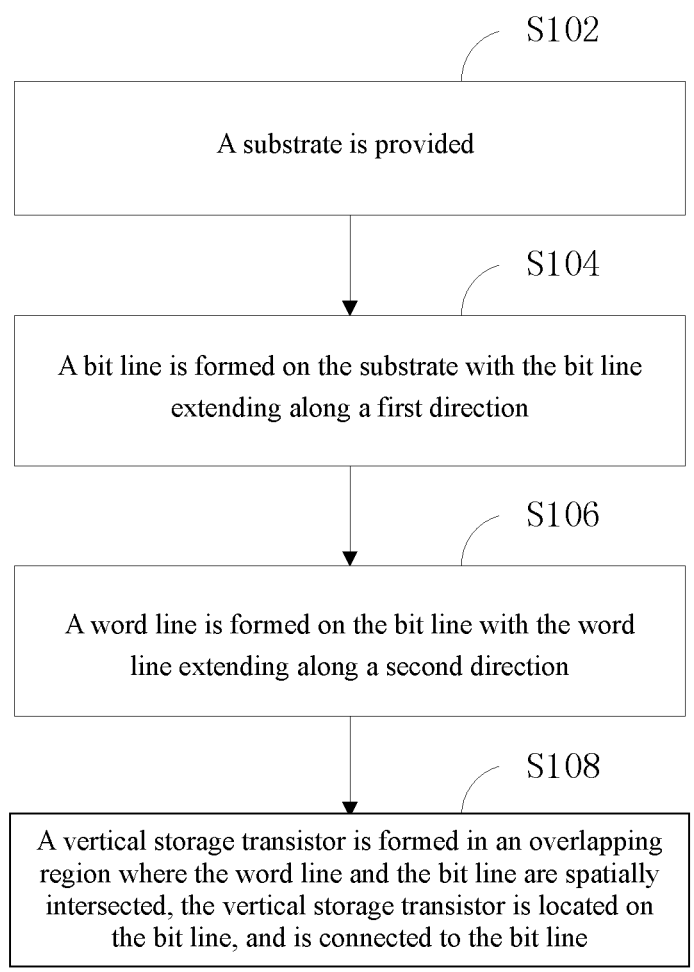
FIG. 2 illustrates a flowchart of a method for manufacturing an integrated circuit memory according to one or more examples.

Referring to FIG. 2, the disclosure provides a manufacturing method of an integrated circuit memory, which may include the following steps.

In S102, a substrate is provided.

The substrate may be a substrate of a semiconductor material such as silicon, germanium, silicon germanide and gallium arsenide or a Silicon-On-Insulator (SOI) substrate, which is not listed one by one herein.

In S104, a bit line is formed on the substrate, with the bit line extending along a first direction.

In S106, a word line is formed on the bit line, with the word line extending along a second direction.

In S108, a vertical storage transistor is formed in an overlapping region where the word line and the bit line are spatially intersected, with the vertical storage transistor being located in the word line, and connected to the bit line.

According to the manufacturing method of the integrated circuit memory, as the formed storage transistor in the memory is the vertical transistor, compared with the storage transistor of the horizontal structure, the disclosure is more beneficial to reducing the size of the single storage transistor, and then may further effectively reduce the size of the whole memory; and meanwhile, as the vertical storage transistor is located in the word line and connected to the bit line, the step of manufacturing the bit line contact hole for connecting the bit line and the drain region of the storage transistor is omitted, and the preparation process is simple.

Steps of the manufacturing method in the example will be described below in detail in combination with the accompanying drawings.

Figure 3:
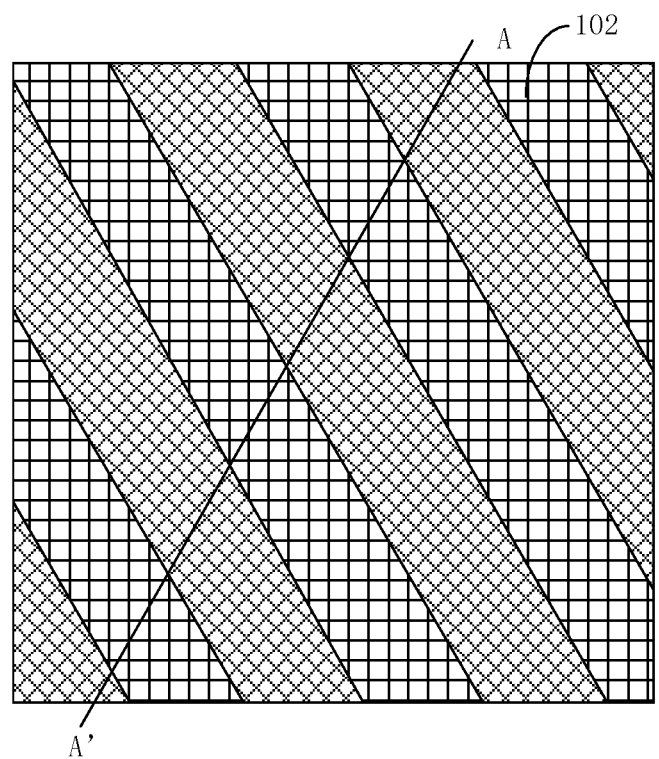
FIG. 3 illustrates a top view of an integrated circuit memory after Step S104 is executed according to one or more examples.
Figure 4:
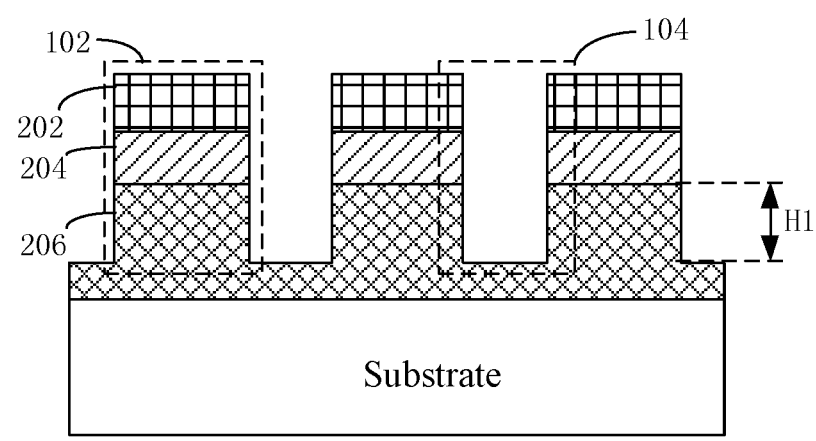
FIG. 4 illustrates a sectional view of an integrated circuit memory along an AA' direction shown in FIG. 3.

FIG. 3 illustrates a top view of an integrated circuit memory after S104 is executed according to an example. FIG. 4 illustrates a sectional view of an integrated circuit memory along an AA' direction shown in FIG. 3.

In combination with FIG. 3 and FIG. 4, in an example, the bit line is of a laminated structure. S104 includes that: a first isolation layer film, a bit line conductive layer film, a bit line work function film and a bit line contact layer film are sequentially formed on the surface of the substrate, and a first mask pattern is formed on the surface of the substrate by means of photolithography process, with the first mask pattern exposing the bit line contact layer film that needs to be removed. After the first isolation layer film, the bit line conductive layer film, the bit line work function film and a part of the bit line contact layer film in a region exposed by the first mask pattern are removed by means of the etching process, a bit line 102 and a first opening 104 located between adjacent bit lines 102 are formed on the surface of the substrate. The bit line 120 is sequentially provided with a bit line contact layer 202, a bit line work function layer (not shown), a bit line conductive layer 204 and a bit line isolation layer 206 from the top surface to the substrate. A distance H1 between the top and the bottom of the bit line isolation layer 206 is greater than or equal to 10 nm and less than or equal to 20 nm. The bit line isolation layer 206 is formed by etching the first isolation layer film, and the remaining unetched first isolation layer film is formed into a first insulation layer between the bit line and the substrate.

The material of the bit line isolation layer 206 includes for example silicon nitride, the material of the bit line conductive layer 204 includes for example tungsten (W), the material of the bit line work function layer at least includes for example one of tungsten silicide and titanium nitride (TiN), and the material of the bit line contact layer 202 includes for example doped polysilicon (Poly).

It is to be noted that for the doped polysilicon layer of the bit line contact layer 202, the conductive type of the doped ion may be adjusted correspondingly according to the conductive type of the vertical storage transistor. For example, if the conductive type of the vertical storage transistor is the P type, the doped polysilicon layer in the bit line contact layer may also correspondingly be the P-type doped.

In an example, the bit line 102 further includes an adhesion layer (not shown) located between the bit line contact layer 202 and the bit line work function layer. The material of the adhesion layer includes for example one or more of titanium, titanium nitride and tungsten silicide.

In other examples, before S104, a step of forming a stress buffer layer between the substrate and the first insulation layer is further included. The material of the stress buffer layer includes for example an oxidation layer. The oxidation layer may have a thickness of 5 nm, and the material, thickness and process of the stress buffer layer may be selected as required in the actual process.

Exemplarily, S104 specifically includes that: first step, an oxidation layer (such as 5 nm) for buffering a stress is formed on the surface of the substrate by means of a thermal oxidation process; second step, a layer of silicon nitride film (such as 100 nm) is formed on the oxidation layer by means of a furnace tube process; third step, a layer of tungsten metal film (such as 21 nm) is deposited on the silicon nitride by means of a physical vapor deposition (PVD) process; fourth step, a layer of tungsten silicide film (such as 2.5 nm) is deposited on the tungsten metal film by means of a chemical vapor deposition (CVD) process, and proportions of tungsten and silicon in the tungsten silicide film may be adjusted according to requirements on the bit line resistance;

fifth step, a layer of titanium nitride film (such as 8 nm) is deposited on the tungsten silicide film through the CVD process; sixth step, a layer of titanium film (such as 3 nm) is deposited on the titanium nitride film by means of the PVD process; seventh step, a layer of doped polysilicon film (such as 10 nm) is deposited on the titanium film by means of the furnace tube process; and eighth step, the bit line 102 and the first opening 104 located between the adjacent bit lines 102 are formed by means of the photolithography process and the etching process. The etching process is stopped at the silicon nitride film on the oxidation layer film. By means of the etching process, the silicon nitride film is divided into a bit line isolation layer 206 composed of an etched portion and a first insulation layer composed of an unetched portion.

Figure 5:
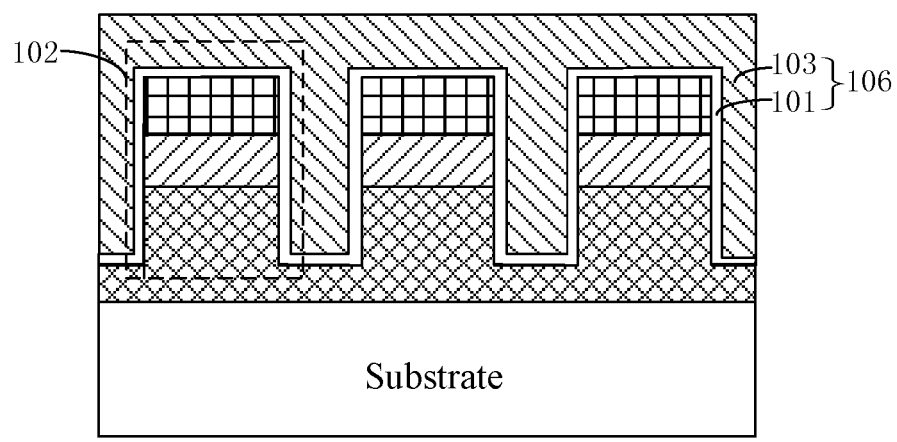
FIG. 5 illustrates a sectional view of an integrated circuit memory along an AA' direction before Step S106 is executed correspondingly in FIG. 4.

FIG. 5 illustrates a sectional view of an integrated circuit memory along an AA' direction before S106 is executed correspondingly in FIG. 4.

In combination with FIG. 5, in an example, before the word line is formed on the bit line, the following step is further included.

An insulation dielectric layer 106 is formed on the integrated circuit memory formed with the bit line, the insulation dielectric layer 106 filling a gap between adjacent bit lines 102, and covering the bit line 102.

By forming the insulation dielectric layer 106 on the integrated circuit memory formed with the bit line, the bit line 102 and the bit line 102, as well as the bit line 102 and the subsequently formed word line, is isolated. In addition, the thickness of the insulation dielectric layer 106 may further be adjusted, to further improve the parasitic capacitance between the bit line 200 and the subsequently formed word line.

In an example, the step that the insulation dielectric layer 106 is formed on the integrated circuit memory formed with the bit line includes that: a pattern protective layer 101 and a first filling layer 103 are sequentially formed on the integrated circuit memory formed with the bit line. The shape of the bit line 102 formed on the substrate may be protected through the pattern protective layer 101, to avoid the influence of the subsequent process on the shape of the bit line, thereby protecting the performance of the memory.

Exemplarily, the step that the insulation dielectric layer 106 is formed on the integrated circuit memory formed with the bit line includes that: first of all, a layer of silicon nitride film (pattern protective layer 101) is deposited by means of an atomic layer deposition (ALD) process on the surface of the integrated circuit memory formed with the bit line, the silicon nitride film covering the surface of the integrated circuit memory formed with the bit line, a surface and a sidewall of the bit line, and a bottom of the first opening 104, and a thickness of the silicon nitride film being far less than a width of the first opening 104 (i.e., distance between adjacent bit lines 104); then, a silicon oxide film is deposited on the silicon nitride film by means of a CVD process to fill the first opening 104 between the adjacent bit lines 102, a top surface of the silicon oxide film being higher than a top surface of the bit line 102; and at last, a planarization process (Chemical Mechanical Polishing (CMP) process) is performed on the surface of the substrate to obtain the insulation dielectric layer 106 composed of the silicon nitride film and the remaining silicon oxide film, a top surface of the insulation dielectric layer 106 being higher than the top surface of the bit line 102.

Figure 6:
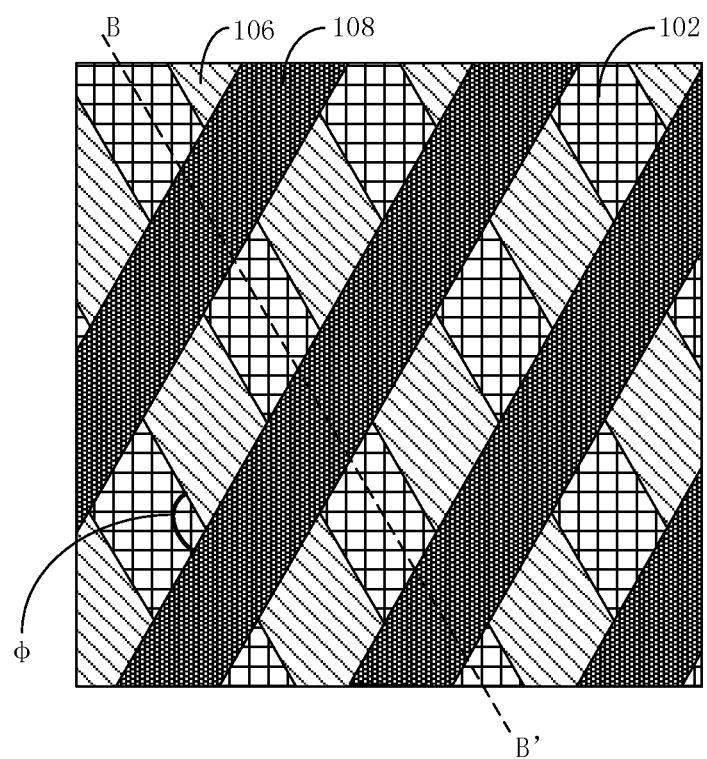
FIG. 6 illustrates a top view of an integrated circuit memory after Step S106 is executed correspondingly in FIG. 5.
Figure 7:
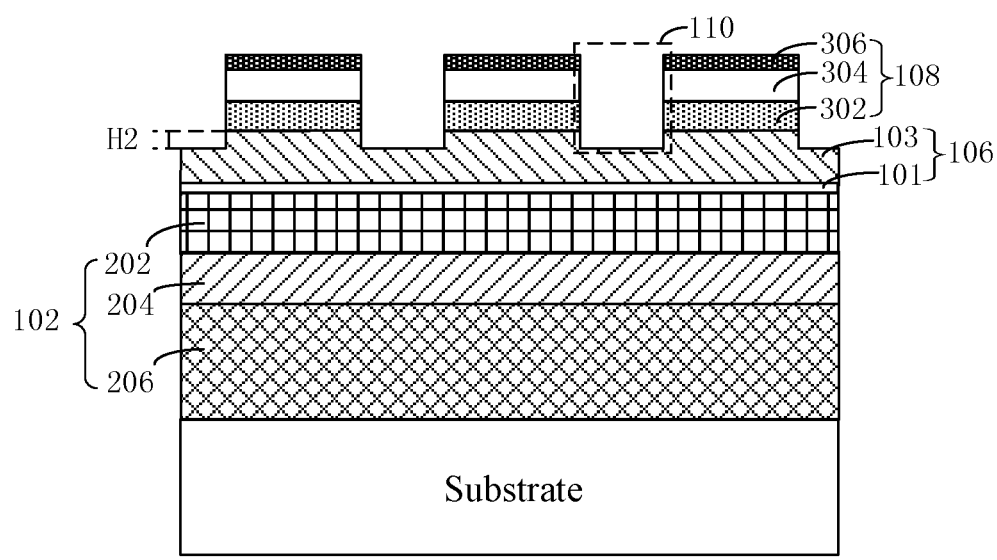
FIG. 7 illustrates a corresponding sectional view along a BB' direction in FIG. 6.

In combination with FIG. 6 and FIG. 7, in an example, the word line is of a laminated structure, and S106 includes that: a word line work function film and a word line conductive layer film are sequentially formed on the surface of the substrate, and a second mask pattern is formed on the surface of the substrate by means of the photolithography process, the second mask pattern exposing a word line conductive layer film that needs to be removed. After the word line conductive layer film and the word line work function film in a region exposed by the second mask pattern are removed by means of the etching process, a word line 108 and a second opening 110 located between adjacent word lines 108 are formed on the surface of the substrate. The word line 108 is sequentially provided with the word line conductive layer 304 and the word line work function layer 302 from the top surface to the top surface of the insulation dielectric layer 106.

The material of the word line work function layer 302 at least includes for example one of titanium, titanium nitride and tungsten silicide, and the material of the word line conductive layer 304 includes for example tungsten (W).

In an example, S106 further includes that: a word line protective film is formed on the word line conductive layer film; and a word line protective layer 306 is provided on the word line 108 which is formed by means of the etching process. In the process of forming the word line 108 by means of the etching process, the word line protective film takes the effects of keeping the shape of the word line 108 and adjusting the etching rate of the etching process. The material of the word line protective layer 306 includes for example silicon nitride.

In an example, the etching process for forming the word line 108 is an over etching process. By means of the over etching process, a first distance between the bottom of the second opening 110 and the word line work function layer 302 is greater than a second distance between the top surface of the insulation dielectric layer 106 and the word line work function layer 302. The word line 108 is formed by means of the over etching process, such that the short-circuit problem arising from the residue of the word line work function film between adjacent word lines 108 due to a process deviation is avoided, and the word lines 108 are isolated by the insulation dielectric layer 106.

Exemplarily, Step S106 specifically includes that: first step, a titanium nitride film (such as 3 nm) is formed by means of the CVD process on the surface of the bit line (i.e., surface of the integrated circuit memory formed with the bit line); second step, a tungsten film (such as 20 nm) is deposited on the titanium nitride film by means of the PVD process; third step, a silicon nitride film (such as 50 nm) is deposited on the tungsten film by means of the furnace tube process; and fourth step, the word line 108 and the second opening 110 are formed on the surface of the substrate by means of the photolithography process and the etching process, the word line 108 being isolated through the insulation dielectric layer 106 below the word line 108. A distance H2 between the lower surface of the word line 108 and the bottom of the second opening 110 is greater than or equal to 5 nm and less than or equal to 10 nm.

In an example, a projection of the second direction in which the word line 108 extends and a projection of the first direction in which the bit line 102 extends are intersected the substrate with a first included angle φ. The first included angle φ has an angle of greater than or equal to 50° and less than or equal to 90°. For example, the first included angle φ is greater than or equal to 60° and less than or equal to 90°, or the first included angle φ is greater than or equal to 50° and less than or equal to 70°, etc.

In an example, a width of the word line 108, a width of the bit line 102, a spacing between adjacent word lines 108 and a spacing between adjacent bit lines 102 are all a preset value, and the preset value is greater than or equal to 30 nm and less than or equal to 60 nm, i.e., the bit line 102 and the first opening 104 are equidistantly arranged on the surface of the substrate at a preset value, and the word line 108 and the second opening 110 are equidistantly arranged on the surface of the substrate at a preset value.

Figure 8:
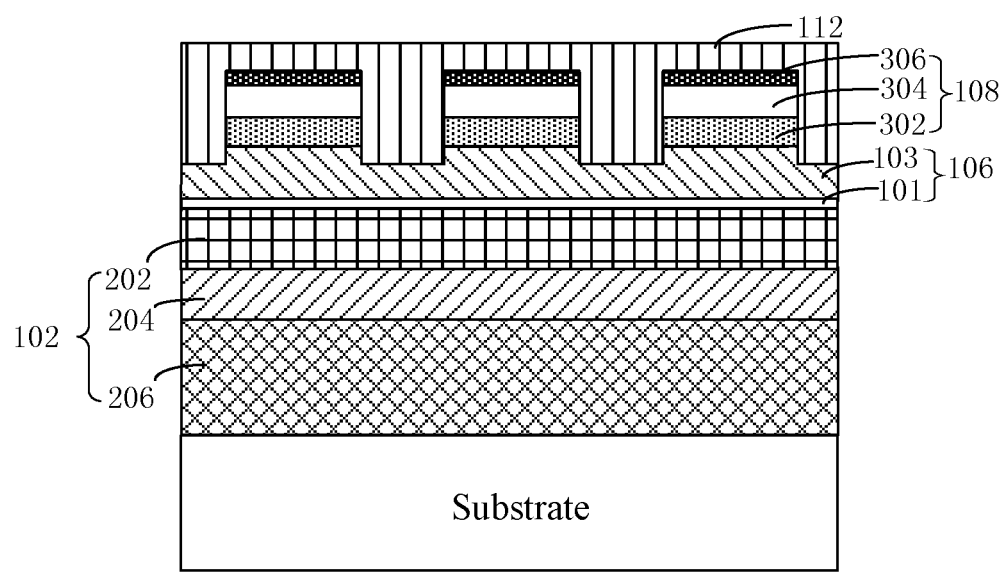
FIG. 8 illustrates a sectional view of an integrated circuit memory after an isolation dielectric layer is formed on a substrate according to one or more examples.

In combination with FIG. 8, in an example, after the word line 108 is formed on the bit line, the following step is further included.

A spacing dielectric layer 112 is formed on the integrated circuit memory with the word line having been formed, in which the spacing dielectric layer 112 fills a gap between adjacent word lines 108, and covering the word line 108. That is, the spacing dielectric layer 112 fills the second opening 110 between the word lines 108, and covers the top surface of the word line 108. The spacing dielectric layer 112 protects the pattern shape of the word line 108 while isolating the word line 108. The material of the spacing dielectric layer 112 includes for example one or more of silicon nitride, silicon oxide and silicon oxynitride.

Exemplarily, the step that the spacing dielectric layer 112 is formed on the integrated circuit memory with the word line having been formed includes that: a layer of silicon nitride film is deposited on the surface of the integrated circuit memory with the word line having been formed, the silicon nitride film filling the second opening 110, and a top surface of the silicon nitride film being higher than the top surface of the word line 108; and then, a planarization process (CMP process) is performed to obtain the spacing dielectric layer 112 composed of the remaining silicon nitride film. The silicon nitride film may be formed by means of the CVD process or the ALD process on the integrated circuit memory with the word line having been formed. The step that the silicon nitride film is formed may also be divided into the following two steps: first step, a first silicon nitride film (such as 5 nm) is deposited by means of the ALD process on the surface of the integrated circuit memory with the word line having been formed, the first silicon nitride film covering the surface of the integrated circuit memory with the formed word line, the surface and the sidewall of the word line, and the bottom of the second opening 110, and while protecting the shape of the word line 108, the first silicon nitride film avoiding the damage to the word line 108 on the sidewall of the through hole in the process of subsequently etching to form the through hole when the silicon nitride film is formed only with the CVD process; and second step, a second silicon nitride film (such as 80 nm) is deposited on the first silicon nitride film by means of the CVD process, the second silicon nitride film filling the second opening 110, and a top surface of the second silicon nitride film being higher than the top surface of the word line 108. The problem of overlong process time when the silicon nitride film is formed only with the ALD process and the silicon nitride film of the same thickness is formed is avoided.

Figure 9:
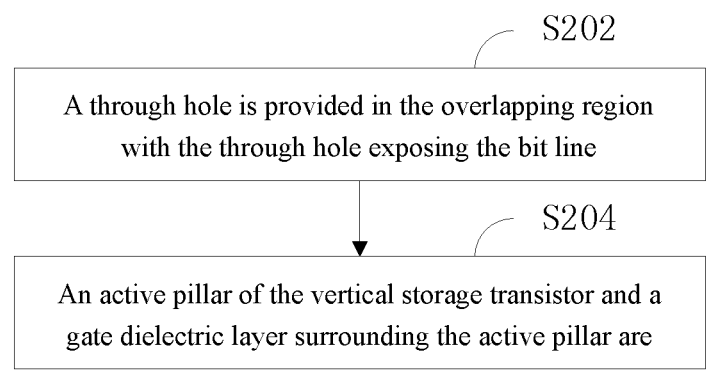
FIG. 9 illustrates a flowchart of forming a vertical storage transistor in an extension direction of a word line according to one or more examples.

In combination with FIG. 9, in an example, the step that the vertical storage transistor is formed in the overlapping region where the word line and the bit line are spatially intersected includes the following steps.

In S202, a through hole is provided in the overlapping region, the through hole exposing the bit line.

Herein, a diameter of the through hole is less than a width of the word line.

Figure 10:
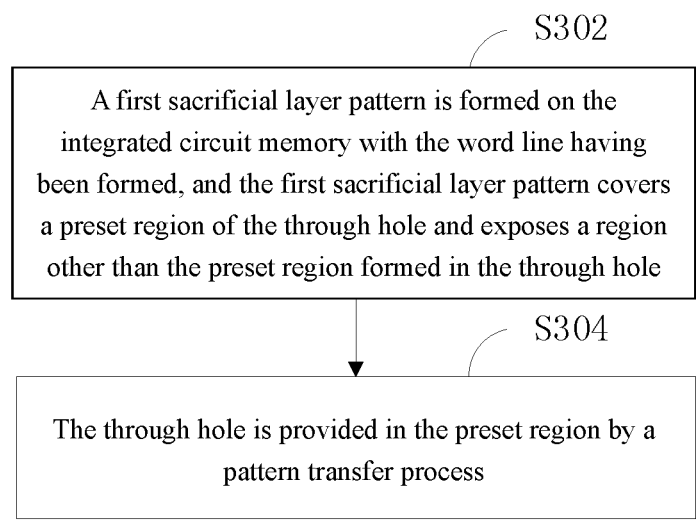
FIG. 10 illustrates a flowchart of providing a through hole in an extension direction of a word line according to one or more examples.

In combination with FIG. 10, in an example, the step that the through hole is provided in the overlapping region includes the following steps.

In S302, a first sacrificial layer pattern is formed on the integrated circuit memory with the word line having been formed, in which the first sacrificial layer pattern covers a preset region of the through hole, and exposes a region other than the preset region.

Figure 11:
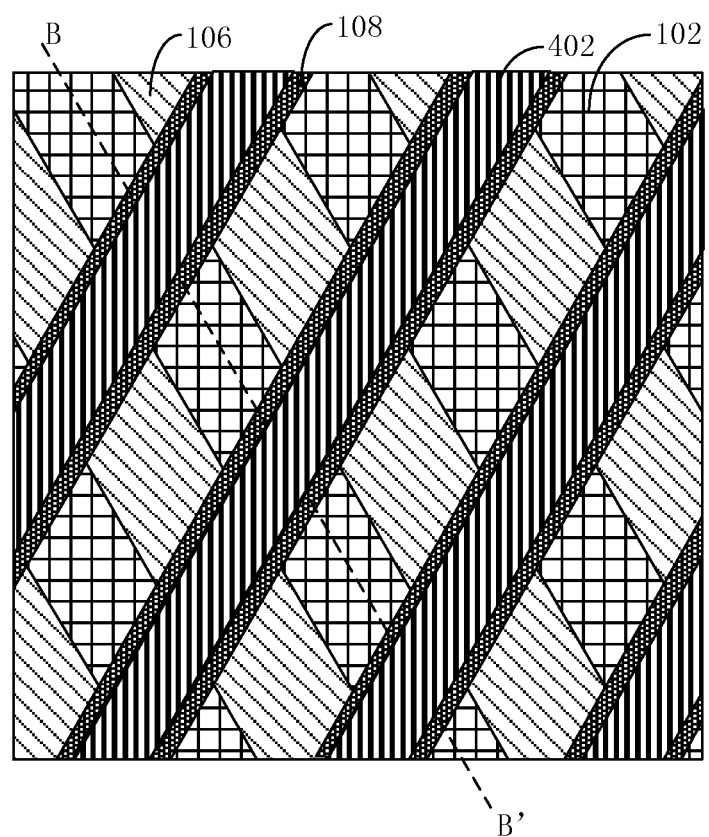
FIG. 11 illustrates a top view of an integrated circuit memory after a transition sacrificial layer pattern along a direction of a word line is obtained in a process of forming a first sacrificial layer pattern through an etching process according to one or more examples.

FIG. 11 illustrates a top view of an integrated circuit memory after a transition sacrificial layer pattern along a direction of a word line is obtained in a process of forming a first sacrificial layer pattern through an etching process.

Figure 12:
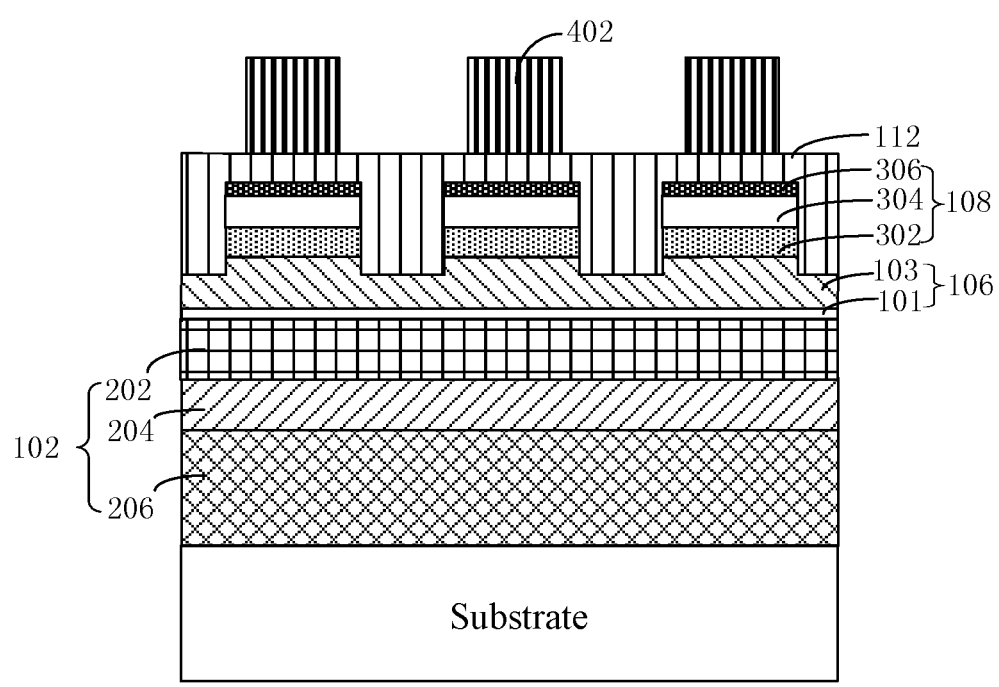
FIG. 12 illustrates a sectional view of an integrated circuit memory along a BB' direction shown in FIG. 11, in which the BB' is a first direction in which a bit line extends.

FIG. 12 illustrates a sectional view of an integrated circuit memory along a BB' direction shown in FIG. 11, in which the BB' is a first direction in which a bit line extends.

Figure 13:
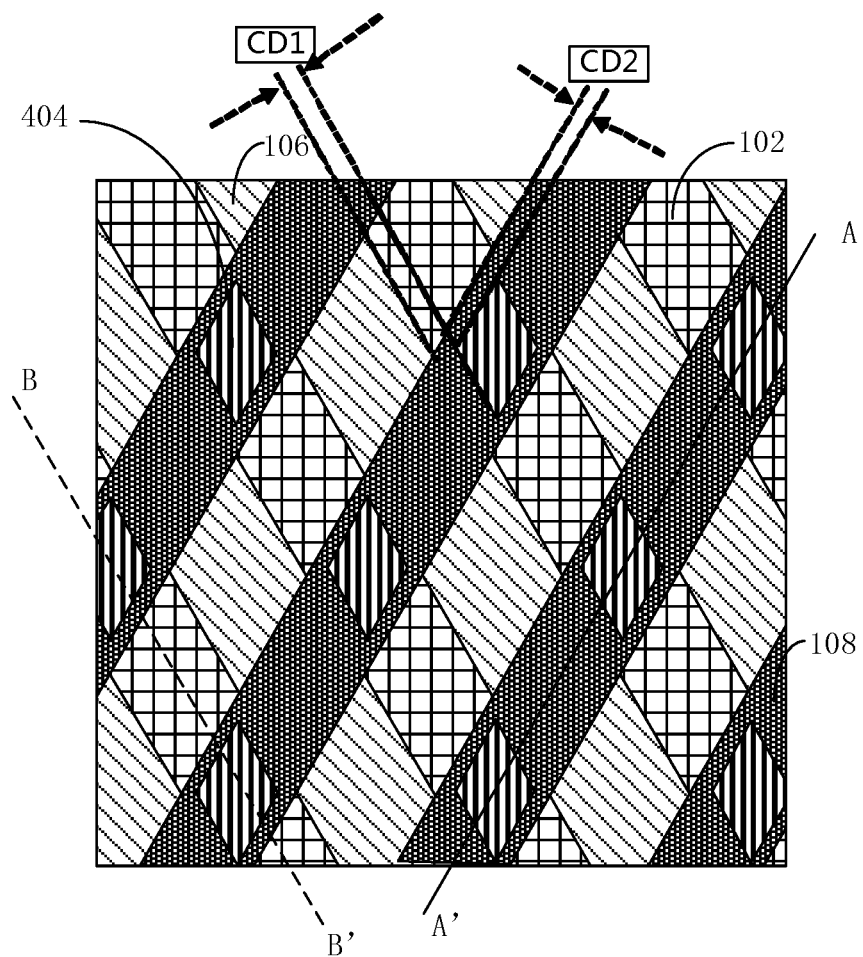
FIG. 13 illustrates a top view of an integrated circuit memory after a first sacrificial layer pattern is formed according to one or more examples.

FIG. 13 illustrates a top view of an integrated circuit memory with a first sacrificial layer pattern having been formed.

Figure 14:
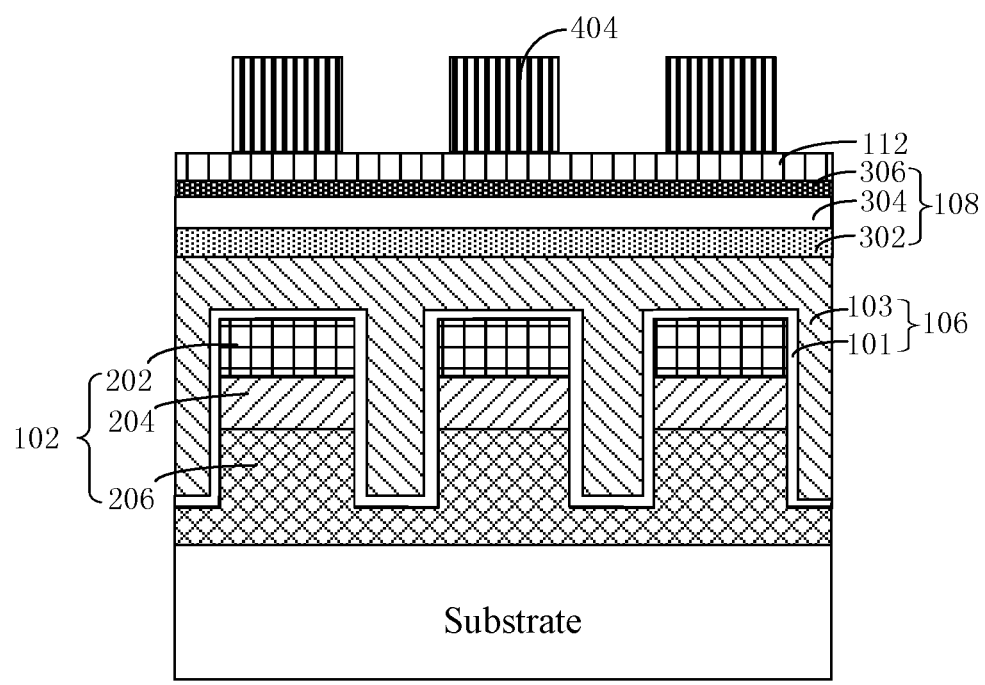
FIG. 14 illustrates a sectional view of an integrated circuit memory along an AA' direction shown in FIG. 13, in which the AA' is a second direction in which a word line extends.

FIG. 14 illustrates a sectional view of an integrated circuit memory along an AA' direction shown in FIG. 13, in which the AA' is a second direction in which a word line extends.

In combination with FIG. 11 to FIG. 14, the step that the first sacrificial layer pattern is formed on the integrated circuit memory (i.e., substrate) with the word line having been formed includes the following steps. At the first step, a first sacrificial layer film is formed on the surface of the integrated circuit memory with the word line having been formed, and the first sacrificial layer film may be a laminated film, for example, including a polysilicon layer (such as 50 nm), an SOC (80 nm) and SION (20 nm) sequentially formed on the surface of the integrated circuit memory with the word line having been formed. At the second step, a part of the first sacrificial layer film is removed by means of the photolithography process and the etching process along the second direction to obtain a transition sacrificial layer pattern 402 composed of the remaining first sacrificial layer film on the word line 108, in which the transition sacrificial layer pattern 402 extends along the second direction of the word line 108, and a width of a projection of the transition sacrificial layer pattern 402 on the surface of the word line 108 along the second direction is less than the width of the word line 108 (as shown in FIG. 11). At the third step, a part of the transition sacrificial layer pattern 402 is removed by the photolithography process and the etching process along the first direction to obtain the first sacrificial layer pattern 404 composed of the transition sacrificial layer pattern 402 on the word line 108. The etching process in the second step and third step takes the spacing dielectric layer 112 as the etching stop layer. The first sacrificial layer pattern 404 is symmetric with respect to a central line of each of the word line and the bit line. A distance CD2 between an edge of a projection of the first sacrificial layer pattern 404 on the substrate and an edge of a projection of the located word line 108 on the substrate, and a distance CD1 between the edge of the projection of the first sacrificial layer pattern 404 on the substrate and an edge of a projection of the lower bit line 102 on the substrate are equal, and are greater than or equal to 3 nm and less than or equal to 8 nm.

In S304, the through hole is provided in the preset region by means of a pattern transfer process.

Figure 15:
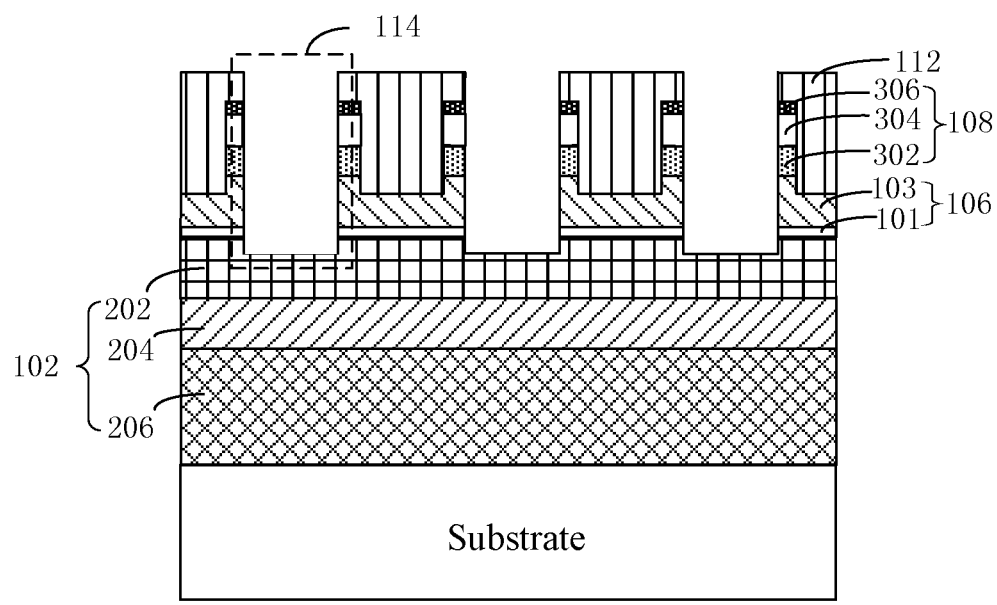
FIG. 15 illustrates a sectional view of an integrated circuit memory formed with a through hole along a BB' direction after Step S304 according to one or more examples.
Figure 16:
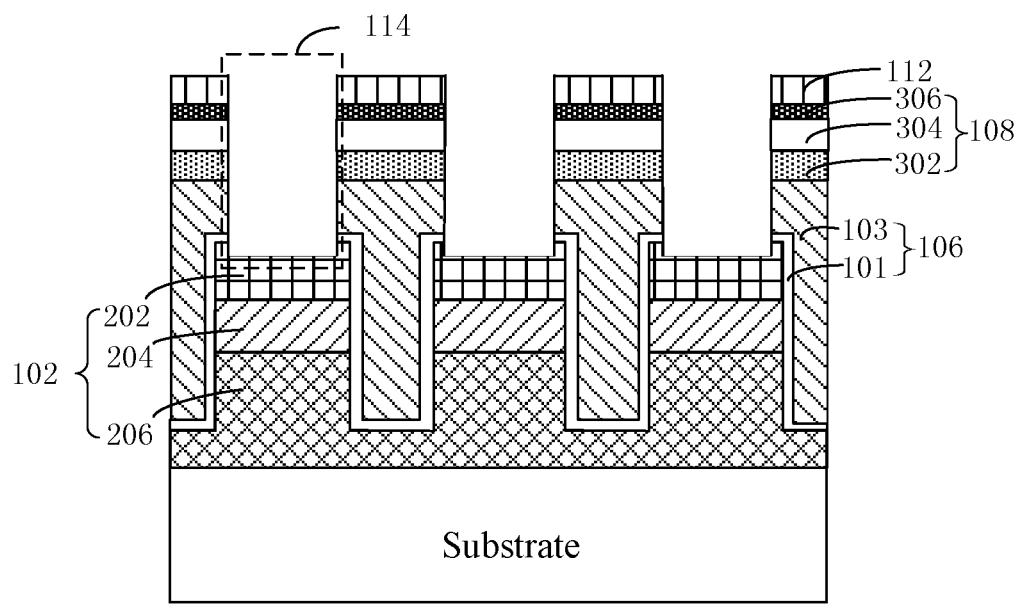
FIG. 16 illustrates a sectional view of an integrated circuit memory formed with a through hole along an AA' direction after Step S304 according to one or more examples.

In combination with FIG. 15 and FIG. 16, S304 specifically includes that: first step, an etching protective layer (not shown) is formed on the surface of the integrated circuit memory with the word line having been formed, a top surface of the etching protective layer and a top surface of the first sacrificial layer pattern 404 being on the same horizontal plane, the material of the etching protective layer including silicon oxide, and the step that the etching protective layer is formed including that: a layer of oxidation layer film (such as 100 nm) filling a gap between the through holes and having a top surface located on the top surface of the first sacrificial layer pattern 404 is deposited on the surface of the integrated circuit memory with the word line having been formed, and then a planarization process is performed till the top surface of the first sacrificial layer pattern 404, and by this time, the remaining oxidation layer film is formed into the etching protective layer; second step, the first sacrificial layer pattern 404 and the spacing dielectric layer 112, the word line 108 and the insulation dielectric layer 106 in a preset region thereunder are removed by means of the photolithography process and the etching process till the bit line 102, to form the through hole 114; and third step, the etching protective layer on the surface of the integrated circuit memory with the word line having been formed is removed.

In an example, the etching process for forming the through hole 114 is the over etching process. By means of the over etching process, there is no residue of the insulation dielectric layer 106 on the bottom of the through hole 114, and the residue of the insulation dielectric layer on the bottom of the through hole 114 due to the process deviation is avoided affecting the contact between the vertical transistor formed in the through hole 114 subsequently and the bit line 102. In an example, a distance between the bottom of the through hole 114 and the top (top surface) of the bit line 102 is greater than or equal to 3 nm and less than or equal to 5 nm.

In S204, an active pillar of the vertical storage transistor and a gate dielectric layer surrounding the active pillar are formed in the through hole.

In combination with FIG. 17 to FIG. 20, in an example, the step that the active pillar of the vertical storage transistor and the gate dielectric layer surrounding the active pillar are formed in the through hole 114 includes the following steps.

In S402, an annular gate dielectric layer is formed on a sidewall of the through hole.

In an example, the step that the annular gate dielectric layer is formed on the sidewall of the through hole includes the following steps.

A gate dielectric layer film is formed in the through hole 114 which covers the sidewall of the through hole and a bottom wall of the through hole.

A protective layer film is formed on the gate dielectric layer film.

The gate dielectric layer film and the protective layer film on the surface and the bottom wall of the substrate are removed through an etching process, and an opening exposing the bit line is provided in the through hole.

A distance between a bottom of the opening and a top of the bit line is greater than or equal to 5 nm and less than or equal to 8 nm, such that the bit line 102 under the opening is completely exposed, and the residue of the gate oxidation layer or protective layer on the bit line 102 due to the process deviation is avoided affecting the connection between the drain of the vertical transistor and the bit line; and a distance between a bottom of the through hole and the top of the bit line is greater than or equal to 3 nm and less than or equal to 5 nm.

Figure 17:
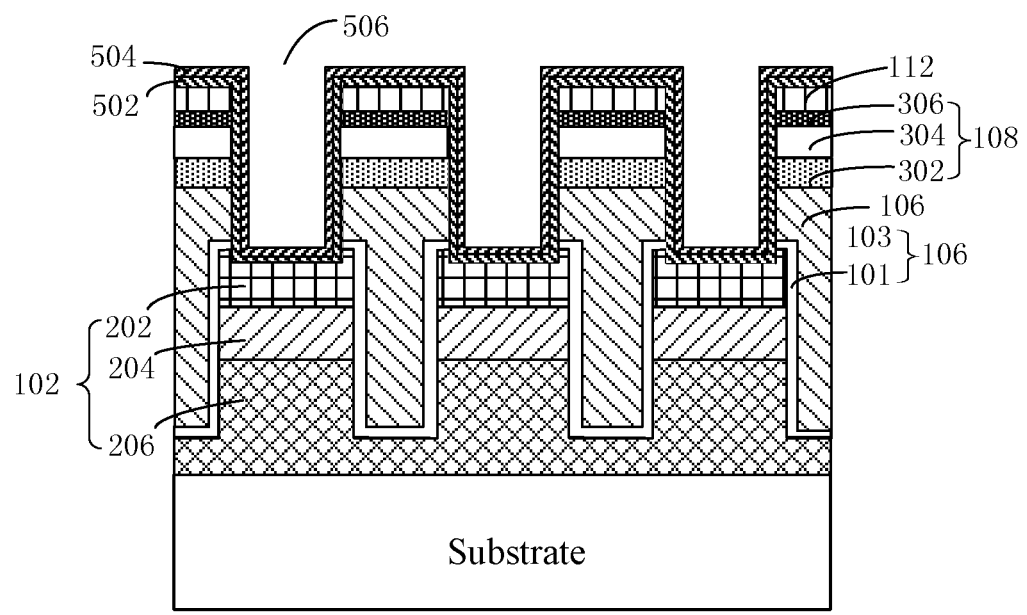
FIG. 17 illustrates a sectional view of an integrated circuit memory along an AA' direction after a gate dielectric layer film is formed according to one or more examples.
Figure 18:
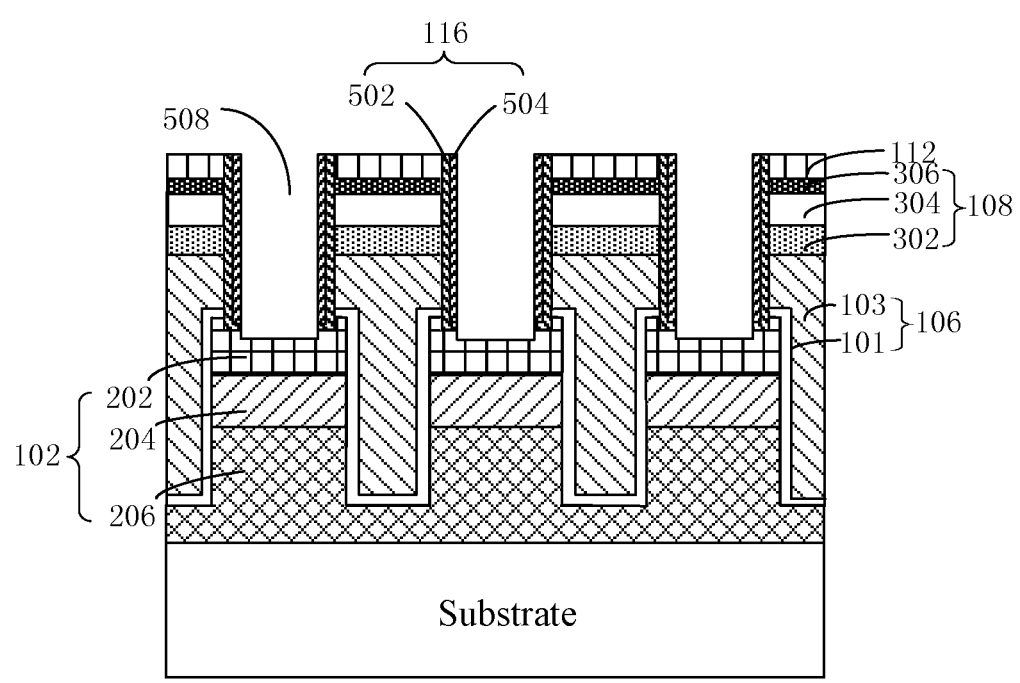
FIG. 18 illustrates a sectional view of an integrated circuit memory along an AA' direction after an annular gate dielectric layer is formed according to one or more examples.

In combination with FIG. 17 and FIG. 18, the step that the annular gate dielectric layer is formed on the sidewall of the through hole 114 includes the following step. First of all, an oxidation layer film 502 (such as 8 nm) is formed on the surface of the integrated circuit memory with the word line having been formed by means of the ALD process, in which the oxidation layer film 502 covers the surface of the integrated circuit memory with the word line having been formed, the surface of the spacing dielectric layer 112, and the sidewall and bottom of the through hole 114. Then, a silicon film 504 is deposited on a surface of the oxidation layer film 502, the silicon film 504 taking an effect of protecting the oxidation layer film 502 on the sidewall of the through hole 114, and by this time, a third opening 506 is formed in the through hole 114. Next, the silicon film 504 and the oxidation layer film 502 on the surface of the substrate, the surface of the spacing dielectric layer 112 and the bottom of the through hole 114 as well as a part of the bit line contact layer 202 (such as 6 nm) on the surface of the bit line 102 are removed by means of the etching process to obtain the annular gate dielectric layer 116 composed of the oxidation layer film 502 on the sidewall of the through hole 114 and the fourth opening 508 in the through hole 114. The annular gate dielectric layer 116 surrounds the sidewall of the through hole 114, such that the control of the gate on the formed vertical transistor is improved, and the operation efficiency of the integrated circuit memory is improved.

In S404, a drain, a source and a channel region of the vertical storage transistor are formed in the through hole.

The active pillar is formed in the through hole, a first doped region 118 is formed in a lower end portion of the active pillar, the first doped region 118 is connected to the bit line, a second doped region 122 is formed in an upper end portion of the active pillar, the second doped region 122 is configured to connect a storage element (not shown), and a third doped region 120 is formed between the lower end portion and the upper end portion of the active pillar. The first doped region 118, the second doped region 122 and the third doped region 120 are respectively constructed to a drain region, a source region and a channel region of the vertical storage transistor. The second doped region 122 is configured to connect to the storage element (for example, storage capacitor, etc.). The word line 108 connected to the annular gate dielectric layer 116 also serves as a metal gate of the vertical storage transistor.

Figure 19:
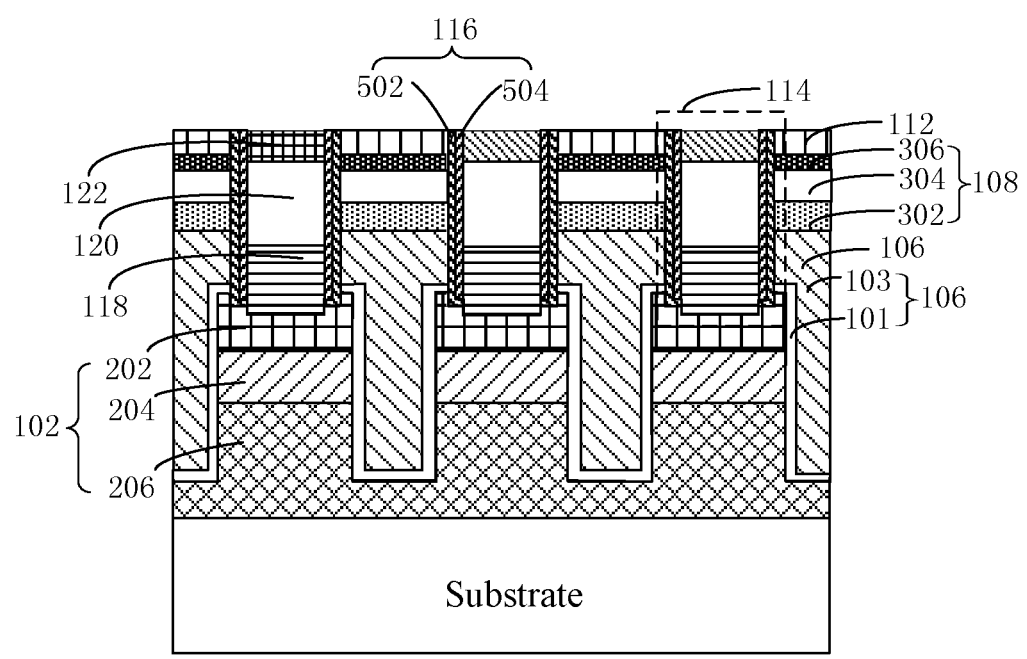
FIG. 19 illustrates a sectional view of an integrated circuit memory along an AA' direction after a vertical storage transistor is formed according to one or more examples.
Figure 20:
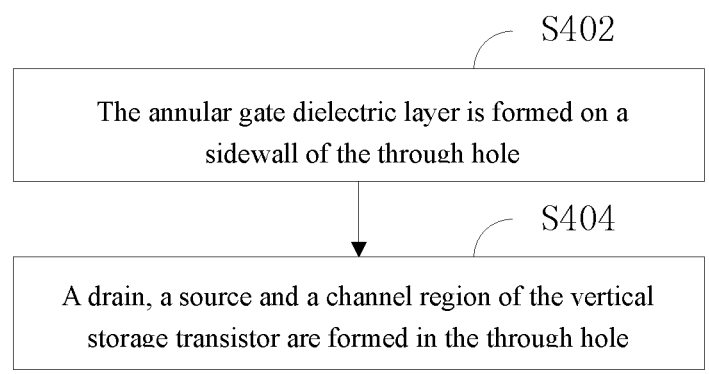
FIG. 20 illustrates a flowchart of forming a vertical storage transistor according to one or more examples.

In combination with FIG. 19, the step that the drain, source and channel regions of the vertical storage transistor are formed in the through hole includes that: 3 times of deposition of silicon with different doping concentrations are sequentially performed in the fourth opening 508 (other substrate materials such as indium gallium arsenide (InGaAs) and gallium arsenide (GaAs) may also be selected), and thus the first doped region 118, the channel region 120 and the second doped region 122 from the bit line 102 up are formed in the fourth opening 508. Specifically, for example, the first doped region 118, the channel region 120 and the second doped region 122 may be formed with an in-situ doping process.

In an example, one overlapping region corresponds to one vertical storage transistor, and a unit configuration size of the vertical storage transistor on the substrate is greater than or equal to 4 times of a square of a minimum feature size.

In an example, six vertical storage transistors equidistantly adjacent to the same vertical storage transistor in the vertical storage transistors are arranged in hexagonal array.

The "unit configuration size" refers to a unit configuration size configured for one storage unit on the substrate, specifically including: a size actually occupied by one storage unit on the substrate, and a spacing size reserved between the storage unit and the adjacent storage unit. For example, if the size occupied by N storage transistors on the substrate is M, the unit configuration size of one storage transistor on the substrate is N/M. For the vertical storage transistor based on the vertical structure, the word line 108 and the bit line 102 are spatially intersected with the overlapping region, one overlapping region corresponding to one vertical storage transistor. According to the existing manufacturing process, the bit line 102 and the word line 108 having the minimum feature size F can be formed, and the space between the formed adjacent bit lines and adjacent word lines is also greater than or equal to the minimum feature size F; then, the width D1' of the vertical storage transistor in a direction perpendicular to the bit line is 2F, and the width D2' in a direction perpendicular to the word line is also 2F; and therefore, the unit configuration size of the corresponding vertical storage transistor may reach $4F^2(2F*2F)$, i.e., the unit configuration size of the vertical storage transistor is greater than or equal to 4 times of the square of the minimum feature size.

According to the manufacturing method of the integrated circuit memory, the vertical storage transistor is formed in the overlapping region where the word line and the bit line are spatially intersected, i.e., the source region, the channel region and the drain region are vertically arranged along a height direction, and the vertical storage transistor is located on the bit line and connected to the bit line. In this way, the step of manufacturing the bit line contact hole to connect the bit line and the drain region of the storage transistor is omitted. Moreover, as the unit configuration size of the vertical storage transistor on the substrate is relatively small (for example, the unit configuration size can reach $4F^2$), the size of the memory may further be correspondingly reduced. Meanwhile, the vertical storage transistor further has the better arrangement flexibility to implement the dense arrangement of the vertical storage transistor.

In combination with FIG. 19, in an example, an integrated circuit memory is further provided, which includes: a substrate, a bit line 102, a word line 108 and a vertical storage transistor. The bit line 102 is formed on the substrate and extends along a first direction.

The word line 108 is formed on the bit line and extends along a second direction.

The vertical storage transistor is formed in an overlapping region where the word line 108 and the bit line 102 are spatially intersected, located on and in the word line 102, and connected to the bit line 102.

In an example, the bit line 102 is of a laminated structure, for example, the bit line 120 includes a bit line isolation layer 206, a bit line conductive layer 204, a bit line work function layer (not shown) and a bit line contact layer 202 sequentially stacked on the substrate. The material of the bit line isolation layer 206 includes for example silicon nitride, the material of the bit line conductive layer 204 includes for example tungsten (W), the material of the bit line work function layer at least includes for example one of tungsten silicide and titanium nitride (TiN), and the material of the bit line contact layer 202 includes for example doped polysilicon (Poly).

It is to be noted that for the doped polysilicon layer of the bit line contact layer 202, the conductive type of the doped ion may be adjusted correspondingly according to the conductive type of the vertical storage transistor. For example, if the conductive type of the vertical storage transistor is the P type, the doped polysilicon layer in the bit line contact layer may also correspondingly be the P-type doped.

In an example, the bit line 102 further includes an adhesion layer (not shown) located between the bit line contact layer 202 and the bit line work function layer. The material of the adhesion layer includes for example one or more of titanium, titanium nitride and tungsten silicide.

In an example, the integrated circuit memory further includes an insulation dielectric layer 106, which is formed on the integrated circuit memory formed with the bit line (i.e., substrate), in which the insulation dielectric layer 106 fills a gap between adjacent bit lines 102, and covers the bit line 102. With the insulation dielectric layer 106, a bit line 102 and another bit line 102, as well as a bit line 102 and a subsequently formed word line, are isolated. In addition, the thickness of the insulation dielectric layer 106 may be adjusted, to further improve the parasitic capacitance between the bit line 200 and the subsequently formed word line.

In an example, the insulation dielectric layer 106 includes: a pattern protective layer 101 and a first filling layer 103. The shape of the bit line 102 formed on the substrate may be protected through the pattern protective layer 101, to avoid the influence of the subsequent process on the shape of the bit line, thereby protecting the performance of the memory.

In an example, the word line 108 is of a laminated structure, and includes for example a word line work function layer 302 and a word line conductive layer 304 that are sequentially stacked. In an example, the word line 108 further includes a word line protective layer 306 located on the word line conductive layer 304.

In an example, the integrated circuit memory includes: a spacing dielectric layer 112.

The spacing dielectric layer 112 fills a gap between adjacent word lines 108, and covers the word line 108. The spacing dielectric layer 112 protects the pattern shape of the word line 108 while isolating the word line 108. The material of the spacing dielectric layer 112 includes for example silicon nitride.

In an example, the integrated circuit memory further includes a through hole 114, provided in the overlapping region, and exposing the bit line 102, an active pillar of the vertical storage transistor and a gate dielectric layer 116 surrounding the active pillar being arranged in the through hole 114. A diameter of the through hole 114 is less than a width of the word line 108.

In an example, the vertical storage transistor includes: an annular gate dielectric layer 116 and the active pillar.

The annular gate dielectric layer 116 is located on a sidewall of the through hole 114.

The active pillar is located in the through hole 114, a first doped region 118 is formed in a lower end portion of the active pillar and connected to the bit line 102 (directly contacts the bit line 102), a second doped region 122 is formed in a upper end portion of the active pillar, the second doped region 122 is configured to connect a storage element (not shown), and a third doped region 120 is formed between the lower end portion and the upper end portion of the active pillar. The first doped region 118, the second doped region 122 and the third doped region 120 are respectively constructed to a drain region, a source region and a channel region of the vertical storage transistor.

In an example, a width of the word line, a width of the bit line, a spacing between adjacent word lines and a spacing between two adjacent bit lines are all a preset value, and the preset value is greater than or equal to 30 nm and less than or equal to 60 nm, In an example, a projection of the second direction in which the word line 108 extends and a projection of the first direction in which the bit line 102 extends on the substrate are intersected with a first angle. The first angle has an angle of greater than or equal to 50° and less than or equal to 90°. For example, the first angle is greater than or equal to 60° and less than or equal to 90°, or the first included angle is greater than or equal to 50° and less than or equal to 70°, etc. One overlapping region corresponds to one vertical storage transistor. A unit configuration size of the vertical storage transistor on the substrate is greater than or equal to 4 times of a square of a minimum feature size.

In an example, the integrated circuit memory further includes a storage element (not shown), formed above the vertical storage transistor, and electrically connected to the second doped region 122.

According to the integrated circuit memory, the vertical storage transistor is formed in the overlapping region where the word line and the bit line are spatially intersected, i.e., the source region, the channel region and the drain region are vertically arranged along a height direction, and the vertical storage transistor is located on the bit line and connected to the bit line. In this way, a bit line contact hole for connecting the bit line and the drain region of the storage transistor is omitted. Moreover, as the unit configuration size of the vertical storage transistor on the substrate is relatively small (for example, the unit configuration size can reach $4F^2$), the size of the memory may further be correspondingly reduced. Meanwhile, the vertical storage transistor further has the better arrangement flexibility to implement the dense arrangement of the vertical storage transistor.

In an example, a semiconductor integrated circuit device is provided, which includes: a substrate, a first conducting line, a second conducting line and a vertical storage transistor. The first conducting line is formed on the substrate and extends along a first direction.

The second conducting line is formed on the first conducting line and extends along a second direction.

The vertical storage transistor is formed in an overlapping region where the second conducting line and the first conducting line are spatially intersected, located in the second conducting line, and connected to the first conducting line.

According to the semiconductor integrated circuit device, the vertical storage transistor is formed in the overlapping region where the second conducting line and the first conducting line are spatially intersected, i.e., the source region, the channel region and the drain region are vertically arranged along a height direction, and the vertical storage transistor is located on the second conducting line and connected to the first conducting line. In this way, a second conducting line contact hole for connecting the first conducting line and the drain region of the storage transistor is omitted. Moreover, as the unit configuration size of the vertical storage transistor on the substrate is relatively small (for example, the unit configuration size can reach $4F^2$), the size of the memory may further be correspondingly reduced. Meanwhile, the vertical storage transistor further has the better arrangement flexibility to implement the dense arrangement of the vertical storage transistor.

Reference in the specification to "some examples", "other examples", "ideal example" and the like means that a particular feature, structure, material or feature described in connection with the examples or examples is included in at least one example or example of the disclosure. In the specification, the schematic descriptions on the above terms unnecessarily refer to the same example or example.

The technical features of the above examples may be combined freely. In order to describe briefly, the descriptions are not made on all possible combinations of the technical features of the examples. However, the combinations of these technical features should be viewed as a scope of the specification as long as there is no conflict.

The above examples only describe several implementation modes of the disclosure. The description is specific and detailed, but cannot be understood as a limit to a scope of the disclosure accordingly. It should be pointed out that those of ordinary skill in the art may further make multiple changes and improvements without departing from a concept of the disclosure and those also belong to the protection scope of the disclosure. Therefore, the protection scope of the disclosure shall be subjected to the appended claims.

What is claimed is:

1. An integrated circuit memory, comprising:
    a substrate;
    a bit line formed on the substrate and extending along a first direction;
    a word line formed on the bit line and extending along a second direction; and
    a vertical storage transistor formed in an overlapping region where the word line and the bit line are spatially intersected, located in the word line, and connected to the bit line, wherein a lower part of the vertical storage transistor is embedded in the bit line.

2. The manufacturing method of claim 1, wherein the step of forming the vertical storage transistor in the overlapping region where the word line and the bit line are spatially intersected comprises the steps of:
    providing a through hole in the overlapping region with the through hole exposing the bit line; and
    forming an active pillar of the vertical storage transistor and a gate dielectric layer surrounding the active pillar in the through hole,
    wherein a diameter of the through hole is less than a width of the word line.

3. The manufacturing method of claim 2, wherein the step of providing the through hole in the overlapping region comprises the steps of:
    forming a first sacrificial layer pattern which covers a preset region of the through hole, and exposes a region other than the preset region; and
    providing the through hole in the preset region by means of a pattern transfer process.

4. The manufacturing method of claim 2, wherein the step of forming the active pillar of the vertical storage transistor and the gate dielectric layer surrounding the active pillar in the through hole comprises the steps of:
    forming an annular gate dielectric layer on a sidewall of the through hole; and
    forming the active pillar in the through hole with a first doped region being formed in a lower end portion of the active pillar and connected to the bit line, a second doped region being formed on an upper end portion of the active pillar and being configured to connect a storage element, and a third doped region being formed between the lower end portion and the upper end portion of the active pillar,
    wherein the first doped region, the second doped region and the third doped region are respectively constructed to a drain region, a source region and a channel region of the vertical storage transistor.

5. The manufacturing method of claim 1, further comprising:
    forming an insulation dielectric layer on the substrate, with the insulation dielectric layer filling a gap between two adjacent bit lines and covering the bit lines before forming the word line on the bit line.

6. The manufacturing method of claim 1, further comprising:
    forming an insulation dielectric layer on the substrate, with the spacing dielectric layer filling a gap between two adjacent word lines and covering the word lines, after forming the word line on the bit line.

7. The manufacturing method of claim 1, wherein a width of the word line, width of the bit line, a spacing between two adjacent word lines and a spacing between two adjacent bit lines are all a preset value, and the preset value is greater than or equal to 30 nm and less than or equal to 60 nm.

8. The manufacturing method of claim 1, wherein a projection of the second direction in which the word line extends and a projection of the first direction in which the bit line extends on the substrate are intersected with a first angle of greater than or equal to 60° and less than or equal to 90°.

9. The manufacturing method of claim 4, wherein the step of forming the annular gate dielectric layer on the sidewall of the through hole comprises the steps of:
forming a gate dielectric layer film in the through hole, with the gate dielectric layer film covering the sidewall of the through hole and a bottom wall of the through hole;
forming a protective layer film on the gate dielectric layer film; and
removing the gate dielectric layer film and the protective layer film on the bottom wall by an etching process to provide an opening exposing the bit line in the through hole; and
wherein a distance between a bottom of the opening and a top of the bit line is greater than or equal to 5 nm and less than or equal to 8 nm; and a distance between the bottom of the through hole and the top of the bit line is greater than or equal to 3 nm and less than or equal to 5 nm.

10. The manufacturing method of claim 1, wherein one said overlapping region corresponds to one said vertical storage transistor, and a unit configuration size of the vertical storage transistor on the substrate is greater than or equal to 4 times of a square of a minimum feature size.

11. A manufacturing method of the integrated circuit memory according to claim 1, comprising:
providing the substrate;
forming the bit line on the substrate with the bit line extending along the first direction;
forming the word line on the bit line with the word line extending along the second direction; and
forming the vertical storage transistor in the overlapping region where the word line and the bit line are spatially intersected, in which the vertical storage transistor is in the word line, and is connected to the bit line, wherein the lower part of the vertical storage transistor is embedded in the bit line.

12. The integrated circuit memory of claim 11, wherein the integrated circuit memory further comprises a through hole provided in the overlapping region, and exposing the bit line, in which an active pillar of the vertical storage transistor and a gate dielectric layer surrounding the active pillar are arranged; and wherein a diameter of the through hole is less than a width of the word line.

13. The integrated circuit memory of claim 12, wherein the vertical storage transistor comprises:
an annular gate dielectric layer located on a sidewall of the through hole; and
the active pillar located in the through hole, with a first doped region being formed in a lower end portion of the active pillar and connected to the bit line, a second doped region being formed in an upper end portion of the active pillar and being configured to connect a storage element, a third doped region being formed between the lower end portion and the upper end portion of the active pillar, and the first doped region, the second doped region and the third doped region being respectively constructed to a drain region, a source region and a channel region of the vertical storage transistor.

14. The integrated circuit memory of claim 13, wherein the integrated circuit memory further comprises the storage element formed above the vertical storage transistor, and electrically connected to the second doped region.

15. The integrated circuit memory of claim 11, wherein the integrated circuit memory further comprises an insulation dielectric layer, which fills a gap between two adjacent bit lines, and covers the bit lines.

16. The integrated circuit memory of claim 11, wherein the integrated circuit memory comprises an insulation dielectric layer, which fills a gap between two adjacent word lines, and covers the word lines.

17. The integrated circuit memory of claim 11, wherein a width of the word line, a width of the bit line, a spacing between two adjacent word lines and a spacing between two adjacent bit lines are all a preset value, and the preset value is greater than or equal to 30 nm and less than or equal to 60 nm.

18. The integrated circuit memory of claim 11, wherein a projection of the second direction in which the word line extends and a projection of the first direction in which the bit line extends on the substrate are intersected with a first angle of greater than or equal to 60° and less than or equal to 90°.

19. The integrated circuit memory of claim 11, wherein one said overlapping region corresponds to one said vertical storage transistor, and a unit configuration size of the vertical storage transistor on the substrate is greater than or equal to 4 times of a square of a minimum feature size.

20. A semiconductor integrated circuit device, comprising:
a substrate;
a first conducting line formed on the substrate and extending along a first direction;
a second conducting line formed on the first conducting line and extending along a second direction; and
a vertical storage transistor formed in an overlapping region where the second conducting line and the first conducting line are spatially intersected, located in the second conducting line, and connected to the first conducting line, wherein a lower part of the vertical storage transistor is embedded in the first conducting line.

* * * * *